(12) United States Patent
Nagasawa et al.

(10) Patent No.: US 8,174,798 B2
(45) Date of Patent: May 8, 2012

(54) SPIN-TORQUE OSCILLATOR, A MAGNETIC SENSOR AND A MAGNETIC RECORDING SYSTEM

(75) Inventors: Tazumi Nagasawa, Kanagawa-ken (JP); Kiwamu Kudo, Kanagawa-ken (JP); Koichi Mizushima, Kanagawa-ken (JP); Rie Sato, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 333 days.

(21) Appl. No.: 12/555,272

(22) Filed: Sep. 8, 2009

(65) Prior Publication Data

US 2010/0079919 A1 Apr. 1, 2010

(30) Foreign Application Priority Data

Sep. 30, 2008 (JP) ................................ 2008-254351

(51) Int. Cl.
*G11B 5/39* (2006.01)
(52) U.S. Cl. ....................................................... 360/313
(58) Field of Classification Search .................. 360/313, 360/324.1, 324.11, 324.12, 324.2
See application file for complete search history.

(56) References Cited

U.S. PATENT DOCUMENTS

| | | | |
|---|---|---|---|
| 7,602,588 B2 | 10/2009 | Sato et al. | 360/313 |
| 2006/0222835 A1 | 10/2006 | Kudo et al. | 360/324 |
| 2009/0086354 A1 | 4/2009 | Sato et al. | 360/30 |
| 2009/0201614 A1* | 8/2009 | Kudo et al. | 360/324.11 |
| 2010/0007996 A1* | 1/2010 | Iwasaki et al. | 360/324 |
| 2010/0034017 A1* | 2/2010 | Rivkin et al. | 365/171 |
| 2010/0039181 A1* | 2/2010 | Firastrau et al. | 331/94.1 |
| 2010/0134196 A1* | 6/2010 | Cyrille et al. | 331/157 |
| 2010/0142088 A1* | 6/2010 | Iwasaki et al. | 360/110 |
| 2010/0297475 A1* | 11/2010 | Kawakami et al. | 428/811.1 |
| 2010/0321993 A1* | 12/2010 | Nikonov et al. | 365/171 |
| 2010/0328799 A1* | 12/2010 | Braganca et al. | 360/31 |
| 2011/0018647 A1* | 1/2011 | Lee et al. | 331/154 |
| 2011/0038081 A1* | 2/2011 | Contreras et al. | 360/125.03 |
| 2011/0141629 A1* | 6/2011 | Braganca et al. | 360/313 |
| 2011/0205667 A1* | 8/2011 | Yamada et al. | 360/122 |
| 2011/0298069 A1* | 12/2011 | Clinton et al. | 257/421 |

OTHER PUBLICATIONS

Berger, L., *Emission of Spin Waves by a Magnetic multilayer Traversed by a Current*, Physical Review B, vol. 54, No. 13, pp. 9353-9358, Oct. 1, 1996.

Kiselev, S.I. et al., *Microwave Oscillations of a Nanomagnet Driven by a Spin-polarized Current*, Nature, vol. 425, pp. 380-383, Sep. 25, 2003.

Tyberkevych, V. et al., *Angular Dependence of Generation Linewidth of In-plane-magnetized Anisotropic Spintorque Oscillator* (abstracts), Intermag 2008, DP-05, pp. 680-681, May 4, 2008.

* cited by examiner

*Primary Examiner* — Jefferson Evans
(74) *Attorney, Agent, or Firm* — Ohlandt, Greeley, Ruggiero & Perle, L.L.P.

(57) ABSTRACT

In a spin-torque oscillator, a first ferromagnetic layer, a non-magnetic layer and a second ferromagnetic layer are stacked. A pair of electrodes perpendicularly applies a current onto each plane of the first ferromagnetic layer, the non-magnetic layer and the second ferromagnetic layer. The current induces a precession of a magnetization of at least one of the first ferromagnetic layer and the second ferromagnetic layer. The at least one of the first ferromagnetic layer and the second ferromagnetic layer is formed by an in-plane magnetization film having a uniaxial magnetic anisotropy. A magnetic field generator generates a magnetic field to control a direction of the magnetization so that a non-linearity frequency shift of the precession by the uniaxial magnetic anisotropy cancels a non-linearity frequency shift of the precession by a demagnetizing field on the in-plane magnetization film.

5 Claims, 5 Drawing Sheets

SPIN-TORQUE OSCILLATOR, A MAGNETIC SENSOR AND A MAGNETIC RECORDING SYSTEM

CROSS-REFERENCE TO RELATED APPLICATIONS

This application is based upon and claims the benefit of priority from Japanese Patent Application No. 2008-254351, filed on Sep. 30, 2008; the entire contents of which are incorporated herein by reference.

FIELD OF THE INVENTION

The present invention relates to a spin-torque oscillator, a magnetic sensor having the spin-torque oscillator, and a magnetic recording system having the magnetic sensor.

BACKGROUND OF THE INVENTION

Since a GMR head utilizing a giant magnetoresistive effect (GMR effect) is widely known, a recording density of a magnetic recording becomes remarkably high. A GMR element includes a multilayer (spin bulb film), i.e., a ferromagnetic layer/a non-magnetic layer/a ferromagnetic layer. In the GMR element, an exchange bias is subjected to one ferromagnetic layer to fix a magnetization, a magnetization of another ferromagnetic layer is changed by an external magnetic field, and a change of relative angle between magnetization directions of two ferromagnetic layers is detected as a change of resistance value. Up to this time, a CIP-GMR element to detect a resistive change by applying a current onto a plane of the spin bulb film, and a CPP-GMR element to detect a resistive change by perpendicularly applying a current onto a plane of the spin bulb film are developed. The CIP-GMR element and the CPP-GMR element can acquire a magnetic resistive ratio (MR ratio) such as several percents, and can process a recording density such as 250 Gbit/inch$^2$, respectively.

In order to cope with high density of magnetic recording, a TMR element utilizing a tunneling magnetoresistive effect (TMR effect) has been developed. The TMR element includes a multilayer (a ferromagnetic layer/an insulator/a ferromagnetic layer), and a tunnel current flows by applying a voltage between the ferromagnetic layers. In the TMR element, the tunnel current is changed by a relative angle between magnetization directions of two (top and bottom) ferromagnetic layers. Accordingly, a change of the relative angle by the external magnetic field is detected as a change of a tunnel resistance value.

The TMR element has the MR ratio larger than the GMR element, and a signal voltage is also larger. However, in the TMR element, not only a pure signal component but also a noise component by a shot noise becomes also larger. As a result, S/N ratio (signal to noise ratio) does not improve. The shot noise is due to fluctuation of a current generated by an electron irregularly passing through a tunnel wall, and increases in proportion to a square root of tunnel resistance. In order to acquire a necessary signal voltage by suppressing the shot noise, a tunnel isolation layer needs to be thin, i.e., the tunnel resistance needs to be lower.

As the recording density is higher, an element size needs to be smaller as the same size as a recoding bit. Accordingly, a junction resistance of a tunnel isolation layer needs to be small, i.e., the tunnel isolation layer needs to be thin. As to the recording density of 300 Gbit/inch$^2$, the junction resistance should be smaller than 1 $\Omega \cdot cm^2$. By converting this to a film thickness of a Mg—O (Magnesium oxidation film) tunnel isolation layer, a tunnel isolation layer having a thickness of two atomic layers should be formed. As the tunnel isolation layer is thinner, two (top and bottom) electrodes easily short-circuit, and the MR ratio falls. As a result, manufacture of this element is extremely difficult. By above-mentioned reason, a limit of the recording density to cope with the TMR element is estimated as 500 Gbit/inch$^2$.

Broadly speaking, the above-mentioned elements utilize a magnetoresistive effect (MR effect). Recently, magnetic white noise has become a problem that is common to MR elements. This white noise occurs due to heat fluctuation of minute magnetization, different from an electric noise such as the shot noise. Accordingly, the white noise becomes a larger problem in proportion to the miniaturization of the MR element. At the recording density of 250~500 Gbit/inch$^2$, the white noise is more notable than the electric noise.

On the other hand, a spin wave oscillator is disclosed in "L. Berger "Emission of spin waves by a magnetic multilayer traversed by a current" Physical Review B 54, 9353 (1996) . . . non-patent reference 1". The spin wave oscillator includes triple-layer (a first ferromagnetic layer/a non-magnetic layer/a second ferromagnetic layer). By perpendicularly applying a current onto a film plane of the spin wave oscillator, a movement of the magnetization is utilized. Concretely, by perpendicularly applying a direct current onto the film plane, an electron is spin-polarized while passing through the first ferromagnetic layer, and the spin-polarized current flows into the second ferromagnetic layer. By correlatively acting the spin of the electron upon a magnetization of the second ferromagnetic layer, a precession of the magnetization is induced in the second ferromagnetic layer. As a result, a micro wave occurs by the precession induced, and the spin wave oscillator oscillates with a frequency corresponding to the micro wave. As to the spin wave oscillator, a high-frequency oscillation voltage occurred at the spin wave oscillator is detected by the MR effect. This technique is disclosed in "S. I. Kiselev et al. "Microwave oscillations of a nanomagnet drives by a spin-polarized current" Nature 425, 380 (2003) . . . . Non-patent reference 2".

The spin wave oscillator of a magnetic material using a spin-transfer effect is called a spin-transfer oscillator or a spin-torque oscillator (STO). By improved miniaturization, the spin-torque oscillator can be manufactured as a size equal to or smaller than "100 nm×100 nm", and the micro wave can be locally generated. In the spin-torque oscillator, an amplitude and a frequency of the precession of a magnetization depend on a magnetic field acting upon the current and the magnetization. A magnetic sensor preparing the spin-torque oscillator having this feature is disclosed in "JP-A 2006-286855 (Kokai) . . . . Patent reference 1".

However, the spin-torque oscillator is a non-linear oscillator, and a film thickness of the ferromagnetic layer is composed by a very thin film such as "nm" unit. Accordingly, a demagnetizing field strongly acts along a direction perpendicular to the plane having the magnetization with the precession. In an in-plane magnetization film, due to the effect of the demagnetizing field, a frequency shifts to a low frequency side when an oscillation amplitude of the magnetization increases. In this case, a fluctuation of the amplitude strongly correlates with a fluctuation of a phase, and a spectrum linewidth does not become narrow. As a result, if the spin-torque oscillator having a wide spectrum linewidth is used as a magnetic sensor, the S/N ratio is low, and sufficient characteristics are not acquired.

As mentioned-above, the spin-torque oscillator has a non-linearity. Concretely, the demagnetizing field which acts on the in-plane magnetization film (precession of magnetization is induced) is large, and the frequency decrease in proportion to increase of the amplitude. As a result, the spectrum linewidth cannot become narrow. Accordingly, a spin-torque oscillator having a narrow spectrum linewidth (stable oscillation frequency) is desired. Furthermore, a magnetic sensor having the spin-torque oscillator, and a magnetic recording system having the magnetic sensor, are desired.

SUMMARY OF THE INVENTION

The present invention is directed to a spin-torque oscillator having a narrow spectrum linewidth (a stable oscillation frequency), a magnetic sensor having the spin-torque oscillator, and a magnetic recording system having the magnetic sensor.

According to an aspect of the present invention, there is provided a spin-torque oscillator comprising: a first ferromagnetic layer; a non-magnetic layer stacked on the first ferromagnetic layer; a second ferromagnetic layer stacked on the non-magnetic layer; a pair of electrodes configured to perpendicularly apply a current onto each plane of the first ferromagnetic layer, the non-magnetic layer and the second ferromagnetic layer, the current inducing a precession of a magnetization of at least one of the first ferromagnetic layer and the second ferromagnetic layer, the at least one of the first ferromagnetic layer and the second ferromagnetic layer being formed by an in-plane magnetization film having a uniaxial magnetic anisotropy; and a magnetic field generator configured to generate a magnetic field to control a direction of the magnetization so that a non-linearity frequency shift of the precession by the uniaxial magnetic anisotropy cancels a non-linearity frequency shift of the precession by a demagnetizing field on the in-plane magnetization film.

DETAILED DESCRIPTION OF THE EMBODIMENTS

Hereinafter, embodiments of the present invention will be explained by referring to the drawings. The present invention is not limited to the following embodiments.

Figure 1:
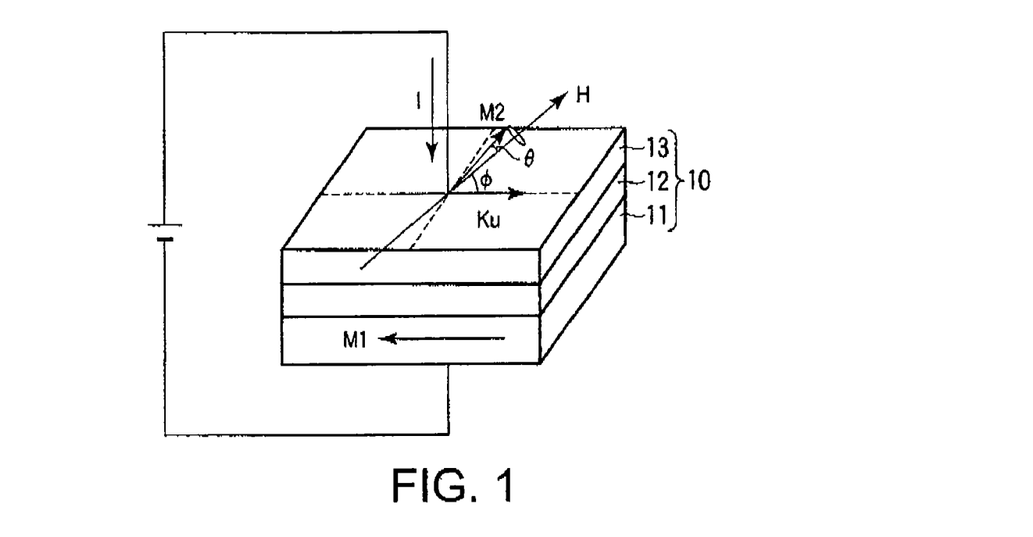
FIG. 1 is a schematic diagram of a spin-torque oscillator according to one embodiment.
Figure 2A:
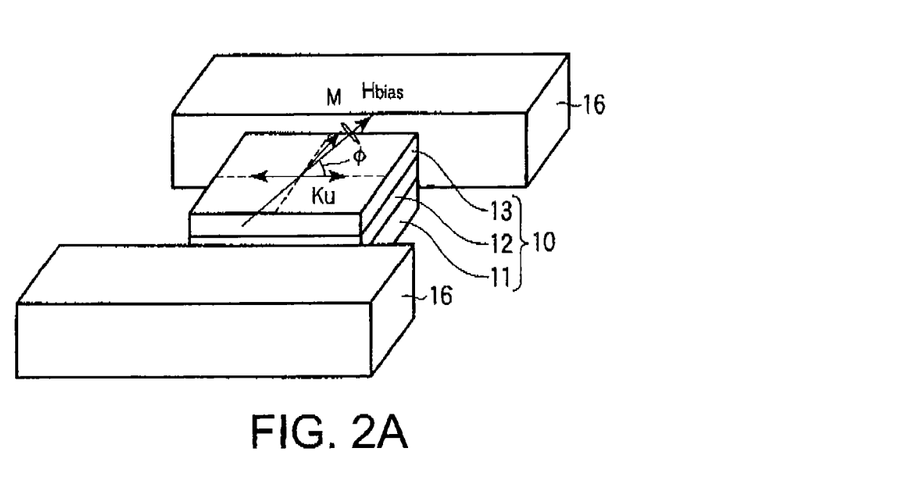
FIGS. 2A and 2B are schematic diagrams of the spin-torque oscillator with a permanent magnet and the spin-torque oscillator with a current line.

FIGS. 1 and 2A show schematic diagrams of a spin-torque oscillator 10 according to one embodiment. As shown in FIG. 1, the spin-torque oscillator is formed as a multilayer, i.e., a first ferromagnetic layer 11, a non-magnetic layer 12 and a second ferromagnetic layer 13 are stacked. The first ferromagnetic layer 11 and the second ferromagnetic layer 13 have magnetizations M1 and M2 respectively. The spin-torque oscillator 10 includes a pair of electrodes to perpendicularly apply a current I onto a film plane. By spin-transfer effect under the applying current I, a precession of magnetization is induced on at least one of the first ferromagnetic layer 11 and the second ferromagnetic layer 13. In this spin-torque oscillator 10, based on the precession (oscillation) of magnetization, a high-frequency oscillation voltage occurs by the MR effect.

The ferromagnetic layer in which the precession is induced is formed as an in-plane magnetization film having an uniaxial magnetic anisotropy Ku. The uniaxial magnetic anisotropy is realized using a crystal magnetic anisotropy that a material having high crystal magnetic anisotropy is deposited or annealed in a magnetic field. Alternatively, the uniaxial magnetic anisotropy is realized using a shape magnetic anisotropy that a shape of the spin-torque oscillator is manufactured as a rectangle or an ellipse.

In the spin-torque oscillator 10 of FIG. 1, the first ferromagnetic layer 11 is a fixed layer, and the magnetization M1 is fixed. The second ferromagnetic layer 13 is a free layer, and the magnetization M2 is not fixed. When a current I is applied, the magnetization M2 is oscillated by spin-transfer effect. As shown in FIG. 2A, a permanent magnet 16 to apply a magnetic field $H_{bias}$ to the spin-torque oscillator 10 is set at both sides of the spin-torque oscillator 10. The permanent magnet 16 is located so that a direction of the magnetization M2 of the second ferromagnetic layer 13 is inclined as angle φ from in-plane easy axis to in-plane hard axis of the uniaxial magnetic anisotropy. Furthermore, the permanent magnet 16 is located by considering effect of a magnetic field from an electric line to apply the current I to the spin-torque oscillator 10. As explained afterwards, by controlling a direction of the magnetization M2 oscillated, the spin-torque oscillator 10 having a stable oscillation frequency is acquired.

Figure 2B:
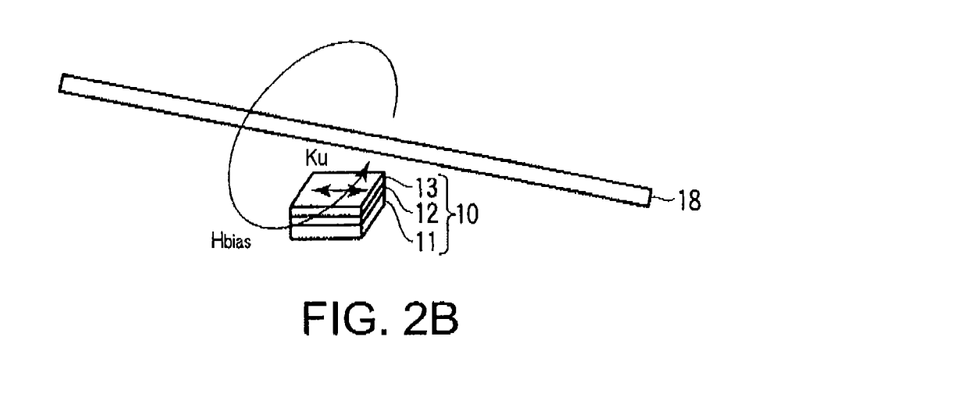

Location of the permanent magnet 16 is not limited to both sides of the spin-torque oscillator 10 as shown in FIG. 2. The permanent magnet 16 may be located at top and bottom of the spin-torque oscillator 10. Briefly, a magnetic field $H_{bias}$ needs to be applied to the second ferromagnetic layer 13 so that a magnetization M2 of the second ferromagnetic layer 13 (precession is induced) turns to a desired direction. Furthermore, a source to generate the magnetic field is not limited to the permanent magnet 16. For example, as shown in FIG. 2B, an electric line 18 is set right above the spin-torque oscillator 10. By applying a current through the electric line 18, a current magnetic field $H_{bias}$ is applied to the second ferromagnetic layer 13, and a direction of magnetization M2 of the second ferromagnetic layer 13 is controlled.

A magnitude and a direction of the magnetic field $H_{bias}$ is controlled by a distance between the electric line 18 and the spin-torque oscillator 10, a direction and a value of the current. In this case, the magnitude of the magnetic field can be changed by a value of the current. Accordingly, even if the spin-torque oscillator 10 has be already manufactured, a direction of magnetization M2 of the second ferromagnetic layer 13 can be slightly adjusted. A method for controlling the direction of magnetization M2 is not limited to the current magnetic field occurred from the electric line 18. A current magnetic field occurred from an electric line to apply a current through the spin-torque oscillator 10 may be utilized. In this case, the current magnetic field may be used by combining the permanent magnet 16 because of problem of power consumption.

In the spin-torque oscillator 10 of FIG. 1, a current I is perpendicularly applied onto a film plane as an arrow of FIG. 1, i.e., the current I is applied from the second ferromagnetic layer 13 to the first ferromagnetic layer 11 via the non-magnetic layer 12. Accordingly, an electron flows along a direction from the first ferromagnetic layer 11 to the second ferromagnetic layer 13. By applying the current through the spin-torque oscillator 10, a spin-polarized electron (by magnetization M1 of the first ferromagnetic layer 11) flows into the second ferromagnetic layer 13, and acts on a magnetization M2 of the second ferromagnetic layer 13. As a result, a precession of the magnetization M2 is induced. By effect of an external magnetic field H, the magnetization M2 having the precession oscillates around the external magnetic field H by an oscillation amplitude θ, and the oscillation frequency depends on the external magnetic field. Accordingly, in the spin-torque oscillator 10 of FIG. 1, as to an amplitude or a phrase of a high-frequency voltage (related with the precession of magnetization M2), or the oscillation frequency, by detecting change based on an external magnetic field H, the external magnetic field H is detected.

If neither the magnetization M1 of the first ferromagnetic layer 11 nor the magnetization M2 of the second ferromagnetic layer 13 is fixed, by applying a current I through the spin-torque oscillator, the precession of the magnetizations M1 and M2 is induced with a predetermined phase difference from the magnetizations M1 and M2. In this case, by detecting a high-frequency voltage occurred from the spin-torque oscillator 10, the external magnetic field H can be detected. The first and second ferromagnetic layers are composed by Co, Ni, Fe, or an alloy including thereof.

A pair of bias magnetic films may be set at both edge parts of at least one of the first and second ferromagnetic layers. One of the first and second ferromagnetic layers may be formed by an exchange coupled film which a ferromagnetic layer (having in-plane magnetic anisotropy) and an antiferromagnetic layer are stacked. One of the first and second ferromagnetic layers may be formed by an exchange coupled film which a ferromagnetic layer (having in-plane magnetic anisotropy), a non-magnetic intermediate layer to control a bias magnetic field, and an antiferromagnetic layer are stacked. One of the first and second ferromagnetic layers may be formed by an exchange coupled film which an artificial ferrimagnetic film (having in-plane magnetic anisotropy) and an antiferromagnetic layer are stacked.

The non-magnetic layer 12 is composed by non-magnetic metal such as Cu, or an isolation film such as MgO or Al—O (aluminum oxidation film). As to the spin-torque oscillator 10 using a tunnel isolation film such as MgO as the non-magnetic layer 12, the MR ratio is large. Accordingly, the output from the spin-torque oscillator 10 can be also large.

Next, a method for controlling a direction of oscillated magnetization M2 for the spin-torque oscillator 10 to stabilize the oscillation frequency, is explained. In general, a film thickness of the ferromagnetic layer of the spin-torque oscillator is very thin such as "nm" unit. Accordingly, a large demagnetizing field $4\pi M_s$ acts along a direction perpendicular to the plane of the ferromagnetic layer.

In the spin-torque oscillator in which the ferromagnetic layer is composed by the in-plane magnetization film without the uniaxial magnetic anisotropy, when the external magnetic field H is applied, the oscillation frequency w of the spin-torque oscillator changes by effect of the demagnetizing field. This frequency change $\delta\omega$ is represented by the oscillation amplitude θ of magnetization of the ferromagnetic layer.

$$\delta\omega = -\frac{\gamma}{8}\frac{4\pi M_s H}{\sqrt{H(H+4\pi M_s)}}\theta^2 \qquad (1)$$

In the equation (1), $M_s$ represents a saturated magnetization of the ferromagnetic layer, and γ represents a gyromagnetic ratio. Apparently from the equation (1), as the oscillation amplitude θ of magnetization increases, the oscillation frequency ω always decreases. Briefly, "$\delta\omega<0$" is concluded for increase of the oscillation amplitude θ, i.e., the oscillation frequency ω changes as red-shift.

Next, in the spin-torque oscillator in which the ferromagnetic layer is composed by the in-plane magnetization film having the uniaxial magnetic anisotropy, the frequency change $\delta\omega$ for the oscillation amplitude θ of the spin-torque oscillator by effect of the uniaxial magnetic anisotropy is explained.

In the spin-torque oscillator in which the ferromagnetic layer is composed by the in-plane magnetization film having the uniaxial magnetic anisotropy, when the external magnetic field H is applied along a direction of the in-plane easy axis of the ferromagnetic layer and magnetization of ferromagnetic layer oscillates along the direction of the in-plane easy axis, a magnetic energy $U_{easy}$ of the spin-torque oscillator is represented as follows.

$$U_{easy} = K_u \sin^2\theta - MH\cos\theta \qquad (2)$$

In the equation (2), $K_u$ represents the uniaxial magnetic anisotropy energy along the direction of the in-plane easy axis, and M represents magnetization of the ferromagnetic layer. Furthermore, a torque $T_{easy}$ to act on the magnetization is represented as follows.

$$\begin{aligned} T_{easy} &= (2K_u\cos\theta + MH)\sin\theta \\ &= MH[1 + (2K_u/MH)\cos\theta]\sin\theta \\ &= MH[1 + (H_k/H)\cos\theta]\sin\theta \end{aligned} \qquad (3)$$

In the equation (3), $H_k$ represents a magnetic field of uniaxial magnetic anisotropy. Accordingly, an effective magnetic field $H_{easy}$ to act on the magnetization is represented as follows.

$$\begin{aligned} H_{easy} &= H[1 + (H_k/H)\cos\theta] \\ &= H + H_k\cos\theta \\ &\cong (H+H_k) - (H_k/2)\theta^2 \end{aligned} \qquad (4)$$

Apparently from the equation (4), as the oscillation amplitude θ of the magnetization increases, the effective magnetic field $H_{easy}$ decreases. Briefly, the oscillation frequency ω decreases ($\delta\omega<0$) for increase of the oscillation amplitude θ, i.e., the oscillation frequency w changes as red-shift.

On the other hand, in the spin-torque oscillator in which the ferromagnetic layer is composed by the in-plane magnetization film having the uniaxial magnetic anisotropy, when the external magnetic field H is applied along a direction of the in-plane hard axis of the ferromagnetic layer and magnetization of ferromagnetic layer oscillates along the direction of the in-plane hard axis, the magnetic energy $U_{hard}$ of the spin-torque oscillator is represented as follows.

$$\begin{aligned} U^*_{hard} &= K_u\sin^2\theta - MH\cos(\pi/2 - \theta) \\ &= K_u\sin^2\theta' - MH\cos(\theta') \end{aligned} \qquad (5)$$

In the equation (5), "θ=π/2−θ'", and θ' represents the oscillation amplitude in case of oscillating along the direction of the in-plane hard axis. Furthermore, a torque $T_{hard}$ to act on the magnetization is represented as follows.

$$T_{hard} = (-2K_u \cos\theta' + MH)\sin\theta' \quad (6)$$
$$= MH[1 - (2K_u/MH)\cos\theta']\sin\theta'$$
$$= MH[1 + (H_k/H)\cos\theta']\sin\theta'$$

Accordingly, an effective magnetic field $H_{hard}$ to act on the magnetization is represented as follows.

$$H_{hard} = H[1 - (H_k/H)\cos\theta'] \quad (7)$$
$$= H - H_k \cos\theta'$$
$$\cong (H - H_k) + (H_k/2)\theta'^2$$

Apparently from the equation (7), as the oscillation amplitude $\theta'$ of the magnetization increases, the effective magnetic field $H_{hard}$ increases. Briefly, the oscillation frequency $\omega$ increases ($\delta\omega>0$) for increase of the oscillation amplitude $\theta'$, i.e., the oscillation frequency $\omega$ changes as blue-shift.

As mentioned-above, the frequency change has non-linearity by effect of the uniaxial magnetic anisotropy. If the ferromagnetic layer has the uniaxial magnetic anisotropy, based on a direction of magnetization oscillated, a sign of the frequency change by the uniaxial magnetic anisotropy (with increase of the oscillation amplitude $\theta$) reverses.

In the spin-torque oscillator in which the ferromagnetic layer has the uniaxial magnetic anisotropy and the magnetization turns to a direction of the in-plane hard axis, the frequency change by effect of the uniaxial magnetic anisotropy represents a blue-shift. On the other hand, the frequency change by effect of the demagnetizing field (acting along direction perpendicular to the plane) represents a red-shift. As a result, the blue-shift cancels the red-shift.

A concrete value to estimate the non-linearity effect is explained. When the external magnetic field H is applied along a direction of the in-plane hard axis and magnetization of ferromagnetic layer oscillates along the direction of the in-plane hard axis, the frequency change $\delta\omega$ by the demagnetizing field is represented as follows.

$$\delta\omega = -\frac{\gamma}{8} \frac{4\pi M_s(H-H_k)}{\sqrt{(H-H_k)((H-H_k)+4\pi M_s)}} \theta^2 = -\gamma H^* \theta^2 \quad (8)$$

$$H^* = \frac{1}{8} \frac{4\pi M_s(H-H_k)}{\sqrt{(H-H_k)((H-H_k)+4\pi M_s)}} \quad (9)$$

For example, in the spin-torque oscillator having the ferromagnetic layer which a demagnetizing field (acting on a direction perpendicular to the plane) is "$4\pi M_s=10^4$ Gauss", when a magnetic field "$H-H_k=5\times10^2$ Oe (Oersted)" is applied, H* is 280 Oe. Furthermore, in the spin-torque oscillator having the ferromagnetic layer which the demagnetizing field is "$4\pi M_s=5\times10^4$ Gauss", when a magnetic field "$H-H_k=10^2$ Oe" is applied, H* is 90 Oe. In this case, H* has the same order as a coefficient $H_k/2$ of frequency change (effective magnetic field change) by uniaxial magnetic anisotropy. Briefly, H* represents a sufficient magnitude to cancel non-linearity effect of the demagnetizing field by non-linearity effect of uniaxial magnetic anisotropy. A magnetic field $H_k$ of the uniaxial magnetic anisotropy can be set as 50~300 Oe by the material or element shape.

In this way, in the spin-torque oscillator, the demagnetizing field acts on the magnetization having a precession in the ferromagnetic layer so that the oscillation frequency decreases in accordance with the increase of the oscillation amplitude of the precession. Furthermore, the ferromagnetic layer in which the precession is induced is formed by the in-plane magnetization film having the uniaxial magnetic anisotropy. If a direction of magnetization is changed from the in-plane easy axis to the in-plane hard axis by the external magnetic field, the oscillation frequency increases in accordance with increases of the oscillation amplitude of the precession increase. Accordingly, by controlling a direction of the magnetization oscillated, non-linearity by effect of the demagnetizing field is canceled with non-linearity by effect of the uniaxial magnetic anisotropy. As a result, non-linearity of the spin-torque oscillator is largely reduced.

Figure 3:
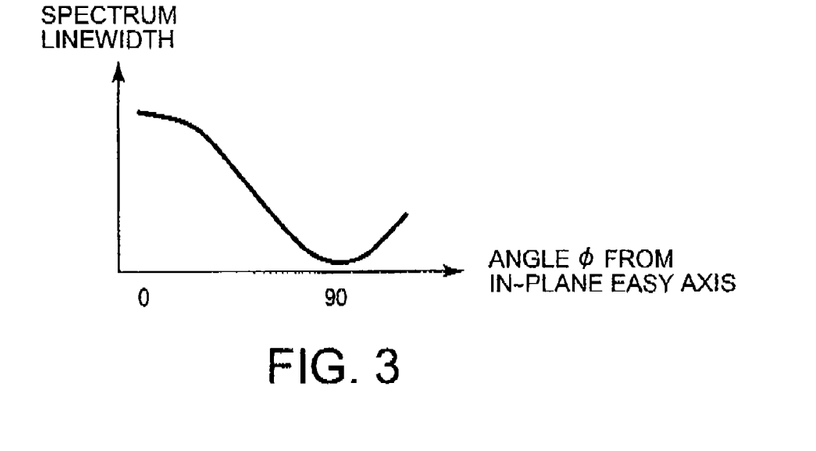
FIG. 3 is a graph showing relationship between a spectrum linewidth and a magnetization angle from in-plane easy axis in the spin-torque oscillator.

FIG. 3 shows relationship between a spectrum linewidth (half-maximum full-width of oscillation spectrum) and an angle $\phi$ of the magnetization direction from the in-plane easy axis. The spectrum linewidth is acquired using Landau•Lifshitz•Gilbert equation (LLG equation) of a single magnetization model. The larger the angle $\phi$ is, the narrower the oscillation linewidth is. The oscillation linewidth is a local minimum value at the angle around 90°. The angle $\phi$ which the oscillation linewidth is the local minimum value changes by parameters such as a saturated magnetization of the ferromagnetic layer, a magnetic field of uniaxial magnetic anisotropy, the external magnetic field, and the current value. However, by turning a direction of the magnetization to the in-plane hard axis, the oscillation linewidth becomes narrow.

As mentioned-above, if the ferromagnetic layer in which the precession is induced is the in-plane magnetization film having the uniaxial magnetic anisotropy, a direction of the magnetization is controlled so that non-linearity by the demagnetizing field and non-linearity by the uniaxial magnetic anisotropy cancel each other. As a result, the spin-torque oscillator which non-linearity is largely reduced and the oscillation linewidth is narrow, i.e., the oscillation frequency is stable, can be acquired.

Figure 4:
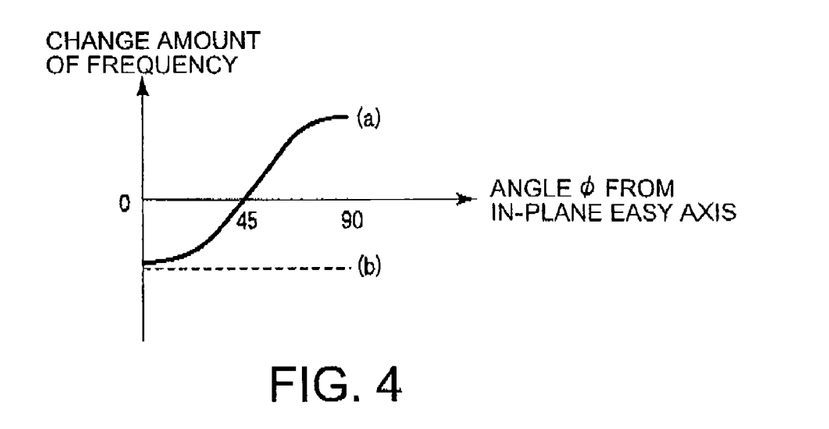
FIG. 4 is a graph showing relationship between a change amount of frequency and a magnetization angle from in-plane easy axis in the spin-torque oscillator having uniaxial magnetic anisotropy.

FIG. 4 shows relationship between a change amount of frequency (by effects of the uniaxial magnetic anisotropy and the demagnetizing field) and an angle $\phi$ of the magnetization direction from the in-plane easy axis, when the magnetization is oscillated with the oscillation amplitude $\theta$. In FIG. 4, a solid line (a) represents the change amount of frequency by the uniaxial magnetic anisotropy, and a dotted line (b) represents the change amount of frequency by the demagnetizing field. As to the solid line (a), the larger the angle $\phi$ is, the larger the change amount of frequency is. As to the solid line (b), the change amount of frequency is a constant value irrespective of the angle $\phi$.

A magnetic field is applied along a direction inclined above 45° from the in-plane easy axis to the in-plane hard axis, and controlled as a suitable magnitude. Briefly, a direction of the magnetization is inclined more than 45° from the in-plane easy axis to the in-plane hard axis. Accordingly, the frequency change by effect of the uniaxial magnetic anisotropy can be blue-shift, and red-shift of the frequency change by effect of the demagnetizing field can be reduced. As a result, as to the spin-torque oscillator, dependency (non-linearity) of the oscillation frequency on the oscillation amplitude is greatly reduced.

Based on above-explanation, in the spin-torque oscillator 10 shown in FIGS. 1 and 2A, the second ferromagnetic layer 13 is formed by the in-plane magnetization film having the uniaxial magnetic anisotropy, and a direction of the magnetization M2 is controlled along a direction inclined above 45° from the in-plane easy axis to the in-plane hard axis. Accordingly, dependency of the oscillation frequency on the oscillation amplitude is greatly reduced, and the spin-torque oscillator 10 having narrow linewidth (stable oscillation frequency) is prepared.

As mentioned-above, in the spin-torque oscillator 10 of the present embodiment, the second ferromagnetic layer 13 is formed by the in-plane magnetization film having the uniaxial magnetic anisotropy, in which the precession of the magnetization M2 is induced by applying a direct current I. A direction of the magnetization M2 is controlled to be inclined above 45° from the in-plane easy axis on the plane by the permanent magnet 16. Under this component, dependency of the oscillation frequency on the oscillation amplitude is greatly reduced, and the spin-torque oscillator 10 having narrow linewidth (stable oscillation frequency) is prepared.

Figure 5:
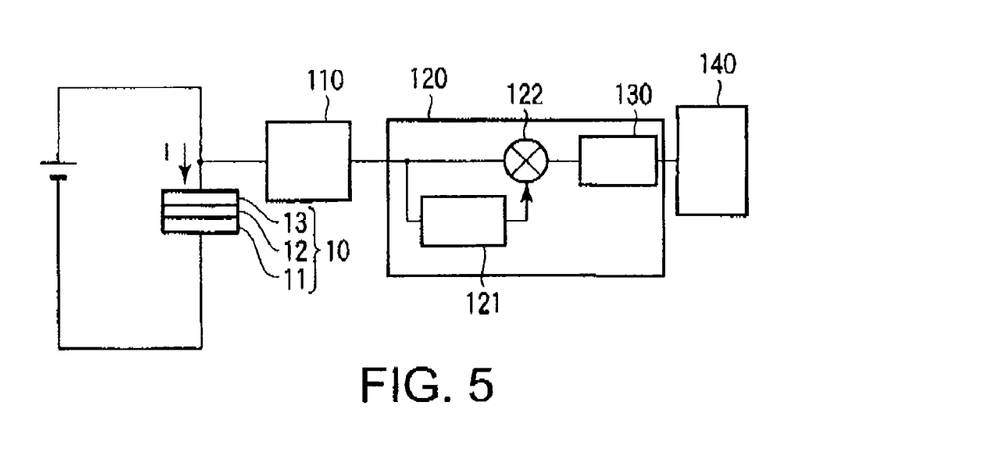
FIG. 5 is a block diagram of a magnetic sensor having the spin-torque oscillator of FIG. 1.

Next, a magnetic sensor of one embodiment is explained by referring to FIG. 5. FIG. 5 is a block diagram of the magnetic sensor having above-mentioned spin-torque oscillator 10. By applying a direct current through the spin-torque oscillator 10, the precession of magnetization is induced in at least one of the first ferromagnetic layer 11 and the second ferromagnetic layer 13, and a high-frequency voltage occurs in the spin-torque oscillator 10 by the magnetoresistive effect. From the high-frequency voltage, a high-frequency component is extracted by a high-pass filter 110, and input to a delay detection circuit 120. In the delay detection circuit 120, the high-frequency component is divided into two components. One is passed through a delay circuit 121 to delay a phase. The other is passed without the delay circuit 121.

Then, these two voltage signals are multiplied by a mixer 122, and input to a low-pass filter 130. The low-pass filter 130 eliminates an extra high-frequency component from the voltage signal multiplied, and the remaining voltage signal is input to a wattmeter to monitor. In this way, a phase change of the high-frequency voltage occurring at the spin-torque oscillator 10 is detected. In this case, a frequency of the precession of magnetization changes from the change of the external magnetic field, and a frequency of the high-frequency voltage (occurring at the spin-torque oscillator 10) also changes. Accordingly, as mentioned-above, the change of this frequency is detected as the phase change of the high-frequency voltage, i.e., the change of the external magnetic field is detected.

In FIG. 5, a circuit to monitor the high-frequency voltage is preferred since the magnetic recording is quickly read out. However, if frequency change or amplitude change of the high-frequency voltage (by change of the external magnetic field) is monitored, any circuit may be used.

As mentioned-above, in the magnetic sensor having the spin-torque sensor, by monitoring the high-frequency voltage occurred at the spin-torque oscillator 10, the change of the magnetic field applied to the spin-torque oscillator can be detected.

Figure 6:
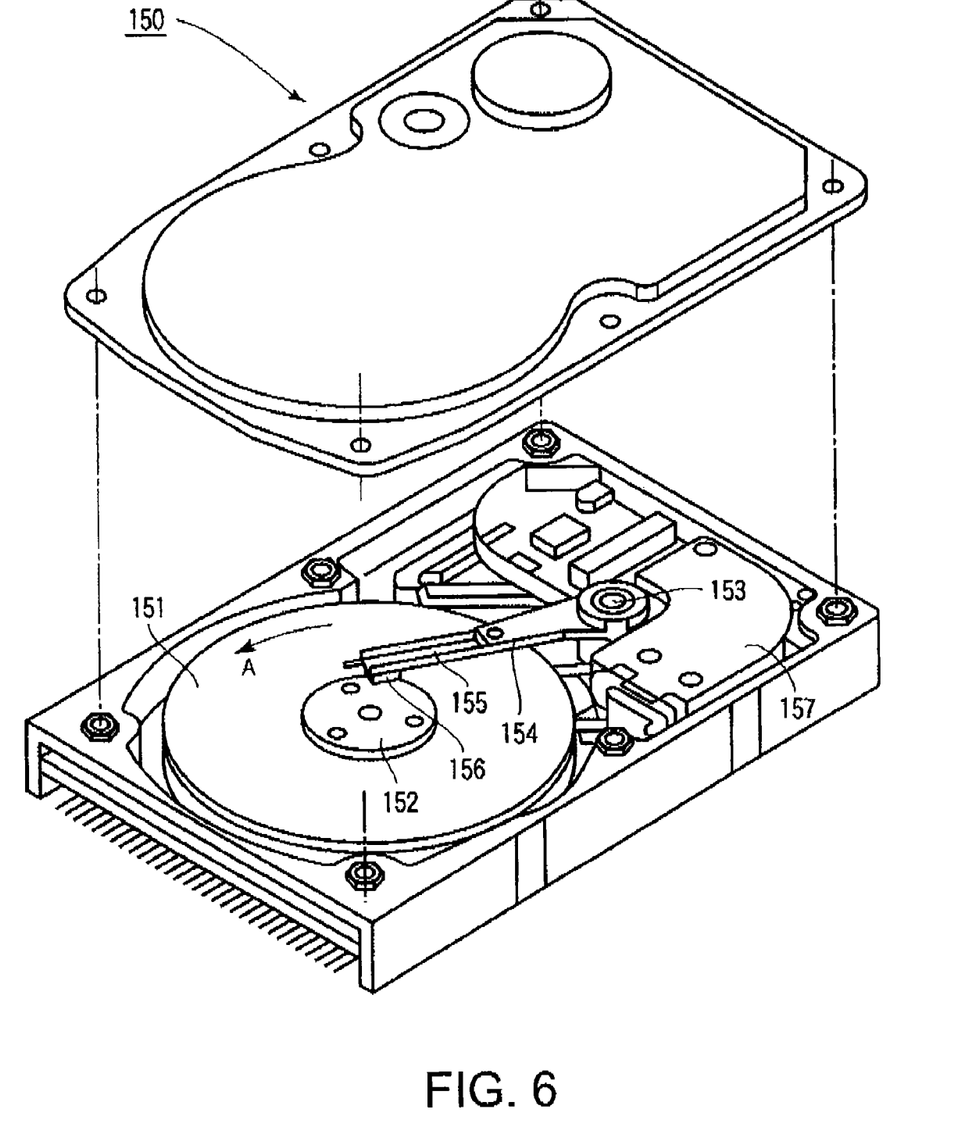
FIG. 6 is a schematic diagram of a magnetic recording system having the magnetic sensor of FIG. 5.

Next, a magnetic recording system of one embodiment is explained by referring to FIG. 6. FIG. 6 is a schematic diagram of the magnetic recording system 150 having the above-mentioned magnetic sensor. In FIG. 6, a magnetic disk (magnetic recording medium) 151 is rotated along an arrow direction A by a spindle motor equipped with a spindle 152. A suspension 155 is equipped with a pivot 153 set adjacent to the magnetic disk 151. A head slider 156 is supported on the lower surface of the suspension 155. A magnetic head having above-mentioned magnetic sensor is installed onto the head slider 156. A voice coil motor 157 is set at the base part of an actuator arm 154.

By rotating the magnetic disk 151 and by rotating the actuator arm 154 with the voice coil motor 157, the head slider 156 is loaded onto the magnetic disk 151. In this case, an air bearing surface (ABS) of the head slider 156 (the magnetic head is loaded) is maintained with a predetermined floating amount from a surface of the magnetic disk 151. Under this condition, information recorded on the magnetic disk 151 can be read out based on above-mentioned principle.

Example 1

Figure 7:
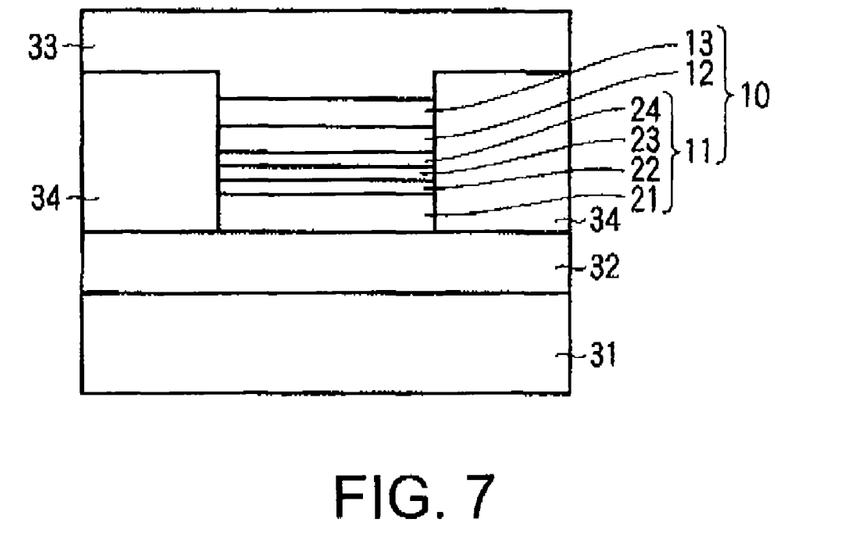
FIG. 7 is a schematic diagram showing component of the spin-torque oscillator of example 1.

In the example 1, a method for manufacturing the spin-torque oscillator 10 and a measurement result of the oscillation characteristic are explained. FIG. 7 shows a sectional plan of the spin-torque oscillator 10 manufactured. In FIG. 7, a film is coated on a glass substrate 31 by a sputtering apparatus. An upper part electrode 33 and a lower part electrode 32 are formed by photo-lithography and ion-milling. A spin-torque oscillator 10 is processed by an electron beam-lithography and the ion-milling.

The first ferromagnetic layer 11 comprises an exchange bias film which an artificial ferrimagnetic film (an intermediate layer 23 is put into two ferromagnetic layers 22 and 24) and an antiferromagnetic layer are stacked, in which the magnetization is fixed. The intermediate layer 23 is composed by Ru, the ferromagnetic layer 22 is composed by CoFe, the ferromagnetic layer 24 is composed by CoFeB, and the antiferromagnetic layer 21 is composed by IrMn. The non-magnetic layer 12 is composed by MgO, and the second ferromagnetic layer 13 is composed by CoFeB. The lower part electrode 32 is composed by Ta/Cu/Ta, the upper part electrode 33 is composed by Au/Cu, and an isolator 34 is composed by $SiO_2$.

By applying the direct current, the precession of magnetization is induced in the second ferromagnetic layer 13 (CoFeB layer). A size of the spin-torque oscillator 10 is an ellipse of "60 nm×120 nm". The uniaxial magnetic anisotropy is assigned to the spin-torque oscillator 13 by a shape anisotropy. In this case, a long axis direction represents the in-plane easy axis, and a short axis direction represents the in-plane hard axis. A magnetic field $H_k$ of the uniaxial magnetic anisotropy is approximately 250 Oe. A resistance of the spin-torque oscillator 10 is 48Ω, and the MR ratio (ΔR/R) is approximately 6.8%. A lead to the upper part electrode 33 and a lead to the lower part electrode 32 are designed so that characteristic impedance is a coplanar guide (waveguide) of 50Ω.

Figure 8:
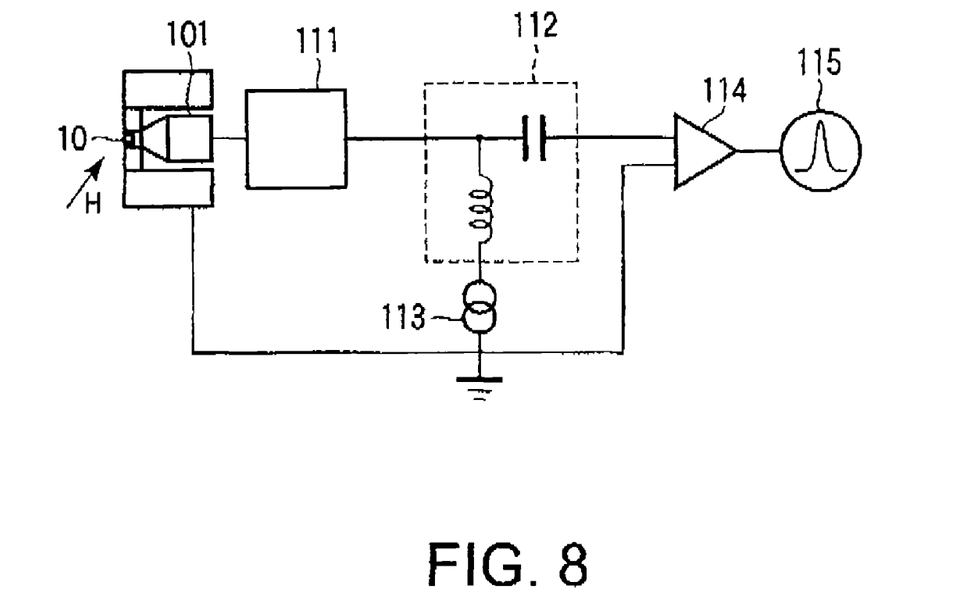
FIG. 8 is a block diagram of a power spectrum measurement system for the spin-torque oscillator of FIG. 7.

FIG. 8 is a measurement system of an oscillation power spectrum of the spin-torque oscillator 10 shown in FIG. 7. At a waveguide 101 to transmit the high-frequency oscillation from the spin-torque oscillator 10, a bias tee 112 is connected via a high-frequency probe 111, an input terminal of an amplifier 114 is connected to an output terminal of the bias tee 112, and a spectrum analyzer 115 is connected to an output terminal of the amplifier 114. Furthermore, a direct current source 113 is connected to the bias tee 112. An external magnetic field H of 700 Oe is applied along a direction having an angle φ from the in-plane easy axis on a plane of the spin-torque oscillator 10.

Figure 9:
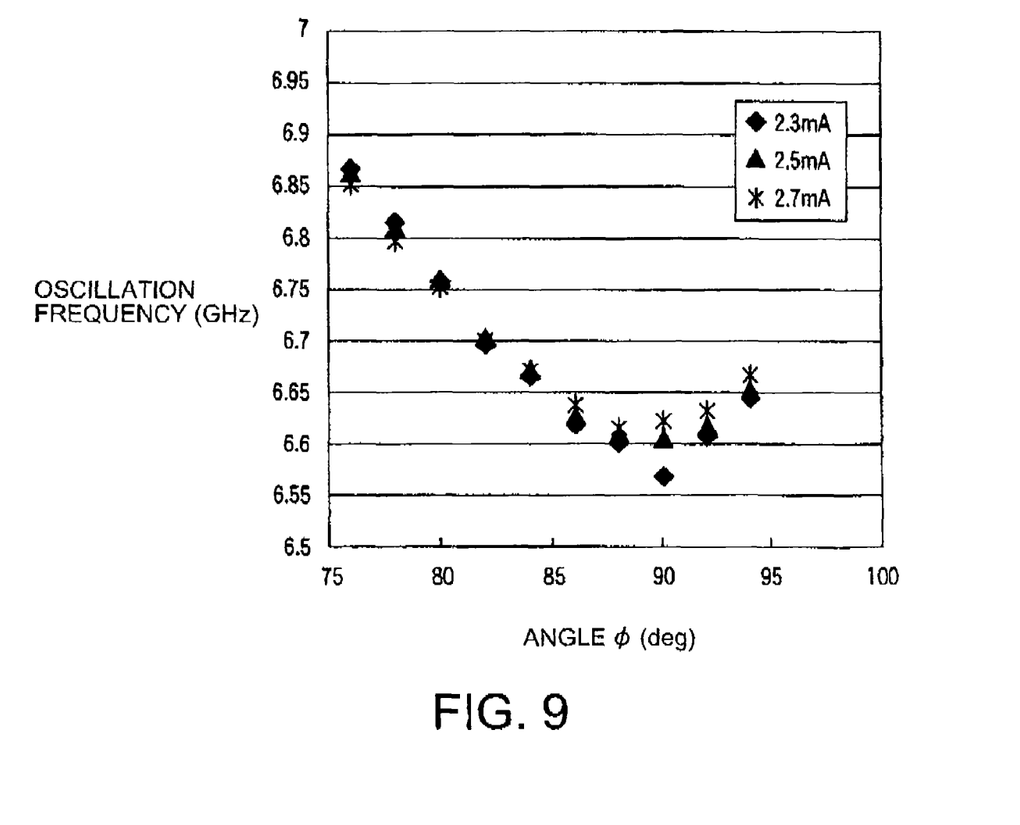
FIG. 9 is a graph showing relationship between an oscillation frequency of various currents and an angle to apply an external magnetic field in the spin-torque oscillator of FIG. 7.

FIG. 9 shows the relationship of the oscillation frequency and the angle φ (of the external magnetic field H) in case of changing the current I. Increase of the current I results in a corresponding increase of the oscillation amplitude θ. As shown in FIG. 9, the oscillation frequency is the minimum value at the angle "φ=90°" along which the external magnetic field is applied. Accordingly, if the angle φ is approximately equal to 90°, the magnetization M2 is decided to be along a direction of the in-plane hard axis.

Next, dependency of the frequency change on the current I (oscillation amplitude) is considered. As to the angle φ below 80°, if the current I is large at a certain angle, the oscillation frequency is low. Briefly, if the angle φ is below 80°, the oscillation frequency represents the red-shift for change of the oscillation amplitude. As to the angle φ equal to 82°, even if the current I changes, the oscillation frequency does not nearly change. As to the angle φ between 84° and 90°, if the current I is large at a certain angle, the oscillation frequency is high. Briefly, if the angle φ is between 84° and 90°, the oscillation frequency represents the blue-shift for change of the oscillation amplitude.

In this case, the spectrum linewidth is approximately 4 MHz at the angle 82°, the spectrum linewidth is approximately 9 MHz at the angle 80°, and the spectrum linewidth is approximately 13 MHz at the angle 84°. Accordingly, a direction of the magnetization is controlled so that non-linearity by effect of the demagnetizing field and non-linearity by effect of the uniaxial magnetic anisotropy cancel each other. Briefly, when the direction of the magnetization is controlled to minimize the frequency change (by change of the current I), the spectrum linewidth is the narrowest.

Other embodiments of the invention will be apparent to those skilled in the art from consideration of the specification and embodiments of the invention disclosed herein. It is intended that the specification and embodiments be considered as exemplary only, with the scope and spirit of the invention being indicated by the claims.

What is claimed is:

1. A spin-torque oscillator comprising:
a first ferromagnetic layer;
a non-magnetic layer stacked on the first ferromagnetic layer;
a second ferromagnetic layer stacked on the non-magnetic layer;
a pair of electrodes configured to perpendicularly apply a current onto each plane of the first ferromagnetic layer, the non-magnetic layer and the second ferromagnetic layer, the current inducing a precession of a magnetization of at least one of the first ferromagnetic layer and the second ferromagnetic layer, the at least one of the first ferromagnetic layer and the second ferromagnetic layer being formed by an in-plane magnetization film having a uniaxial magnetic anisotropy; and
a magnetic field generator configured to generate a magnetic field to control a direction of the magnetization so that a non-linearity frequency shift of the precession by the uniaxial magnetic anisotropy cancels a non-linearity frequency shift of the precession by a demagnetizing field on the in-plane magnetization film.

2. The spin-torque oscillator according to claim 1, wherein the magnetic field generator generates the magnetic field along a direction larger than 45° from the uniaxial magnetic anisotropy on a plane of the at least one of the first ferromagnetic layer and the second ferromagnetic layer.

3. The spin-torque oscillator according to claim 1, wherein the magnetic field generator is a permanent magnet or a line to generate a magnetic field.

4. A magnetic sensor comprising:
the spin-torque oscillator described in claim 1; and
a detection circuit configured to detect change of an amplitude or an oscillation frequency of a high-frequency oscillation voltage induced by an external magnetic field, the high-frequency oscillation voltage being occurred at the spin-torque oscillator by the precession of the magnetization of at least one of the first ferromagnetic layer and the second ferromagnetic layer.

5. A magnetic recording system comprising:
a magnetic head having the magnetic sensor described in claim 4; and
a magnetic recording medium.

* * * * *